(12) United States Patent
Shyu et al.

(10) Patent No.: US 10,714,600 B2
(45) Date of Patent: Jul. 14, 2020

(54) BIPOLAR JUNCTION TRANSISTOR (BJT) BASE CONDUCTOR PULLBACK

(71) Applicant: Taiwan Semiconductor Manufacturing Co., Ltd., Hsin-Chu (TW)

(72) Inventors: Lih-Tien Shyu, Tainan (TW); Yeur-Luen Tu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/793,073

(22) Filed: Oct. 25, 2017

(65) Prior Publication Data

US 2018/0047837 A1    Feb. 15, 2018

Related U.S. Application Data

(62) Division of application No. 14/620,326, filed on Feb. 12, 2015, now Pat. No. 9,831,328.

(51) Int. Cl.
*H01L 29/737* (2006.01)
*H01L 29/66* (2006.01)
(Continued)

(52) U.S. Cl.
CPC .... *H01L 29/7371* (2013.01); *H01L 21/76232* (2013.01); *H01L 21/76264* (2013.01);
(Continued)

(58) Field of Classification Search
CPC .................................................... H01L 29/737
See application file for complete search history.

(56) References Cited

U.S. PATENT DOCUMENTS 5,331,199 A    7/1994 Chu et al.
5,928,967 A    7/1999 Radens et al.
(Continued)

OTHER PUBLICATIONS

Hu. "Bipolar Transistor." Feb. 13, 2009.
(Continued)

*Primary Examiner* — Joseph C. Nicely
*Assistant Examiner* — Lamont B Koo
(74) *Attorney, Agent, or Firm* — Eschweiler & Potashnik, LLC (57) ABSTRACT

Some embodiments are directed to a bipolar junction transistor (BJT) with a collector region formed within a body of a semiconductor substrate, and an emitter region arranged over an upper surface of the semiconductor substrate. The BJT includes a base region arranged over the upper surface of the semiconductor substrate, which vertically separates the emitter and collector regions. The base region is arranged within, and in contact with, a conductive base layer, which delivers current to the base region. The base region includes a planar bottom surface, which increases contact area between the base region and the semiconductor substrate, thus decreasing resistance at the collector/base junction, over some conventional approaches. The base region can also include substantially vertical sidewalls, which increases contact area between the base region and the conductive base layer, thus improving current delivery to the base region.

20 Claims, 11 Drawing Sheets

(51) Int. Cl.
*H01L 29/06* (2006.01)
*H01L 21/762* (2006.01)
*H01L 29/165* (2006.01)
*H01L 21/3213* (2006.01)

(52) U.S. Cl.
CPC .... *H01L 29/0649* (2013.01); *H01L 29/66242* (2013.01); *H01L 21/32135* (2013.01); *H01L 21/32137* (2013.01); *H01L 21/32139* (2013.01); *H01L 29/165* (2013.01)

(56) References Cited

U.S. PATENT DOCUMENTS

| | | | |
|---|---|---|---|
| 2002/0093031 A1 | 7/2002 | Frei et al. | |
| 2002/0192894 A1 | 12/2002 | Kalnitsky et al. | |
| 2004/0188797 A1* | 9/2004 | Khater | H01L 29/66242 257/510 |
| 2005/0215021 A1* | 9/2005 | Chantre | H01L 29/1004 438/313 |
| 2006/0065936 A1 | 3/2006 | Kerr et al. | |
| 2006/0220064 A1* | 10/2006 | Joodaki | H01L 29/1004 257/197 |
| 2010/0019326 A1 | 1/2010 | Knoll et al. | |
| 2013/0009280 A1* | 1/2013 | Camillo-Castillo | H01L 21/8249 257/565 |
| 2014/0151852 A1* | 6/2014 | Adkisson | H01L 29/66242 257/565 |
| 2014/0353725 A1 | 12/2014 | Adkisson et al. | |

OTHER PUBLICATIONS

Non-Final Office Action dated Jul. 27, 2016 for U.S. Appl. No. 14/620,326.
Final Office Action dated Jan. 25, 2017 for U.S. Appl. No. 14/620,326.
Notice of Allowance dated Jun. 21, 2017 for U.S. Appl. No. 14/620,326.

* cited by examiner

BIPOLAR JUNCTION TRANSISTOR (BJT) BASE CONDUCTOR PULLBACK

REFERENCE TO RELATED APPLICATION

This Application is a Divisional of and claims priority to U.S. application Ser. No. 14/620,326 filed on Feb. 12, 2015, the contents of which are hereby incorporated by reference in their entirety.

BACKGROUND

Bipolar junction transistors (BJTs) are commonly used in digital and analog integrated circuit (IC) devices for high frequency applications. A BJT includes two p-n junctions sharing a cathode or anode region, which is called the base. The base separates two regions having a same conductivity type, called the emitter and the collector, which is opposite of the conductivity type of the base. Depending on the conductivity types, a BJT can be of the NPN variety or the PNP variety.

A heterojunction bipolar transistor (HBT) is a type of BJT that uses different semiconductor materials for the emitter/collector and the base. By using different materials, the HBT reduces injection of holes from the base into the emitter region over the BJT. Consequently, the HBT supports higher frequencies than a BJT (e.g., several hundred GHz).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first layer" described in connection with a first figure may not necessarily corresponding to a "first layer" described in connection with another figure.

In some approaches, a vertical BJT is manufactured by forming a collector region (e.g., n-type region) in a semiconductor substrate, forming a base dielectric layer over the collector region, and forming a polysilicon base layer over the base dielectric layer. An etch is then carried out to form an opening which extends through the polysilicon base layer and which terminates at an uppermost surface of the base dielectric layer. A protective liner is formed in the opening to cover sidewalls of the polysilicon base layer and terminate on the uppermost surface of the base dielectric layer. Subsequently, while the protective liner sidewalls are left in place, a bottom portion of the protective liner is removed to expose the uppermost surface of the base dielectric layer. An etch is then performed on this exposed surface to form a recess in the base dielectric layer. This recess extends vertically downwards to an upper portion of the collector region and laterally undercuts the protective sidewalls and edges of the base polysilicon layer nearest the protective sidewalls. A base region (e.g., p-type region) is then selectively grown in the recess and meets the collector region at a collector/base junction, and an emitter region (e.g., n-type region) is subsequently formed over the base region and meets the base region at a base/emitter junction. Thus, a vertical BJT is established. Unfortunately, the recess in which the base region is selectively grown only abuts the bottom planar surface of the base polysilicon layer, and thus, when the base is selectively grown in this recess, there is a relatively small contact area (i.e., high contact resistance) between the base region and base polysilicon layer. Further, the recess often has a rounded (e.g., concave) bottom surface, due to the etching conditions employed. This rounded surface can limit the area of the collector/base junction somewhat, limiting the gain of the BJT.

Therefore, the present disclosure is directed to a vertical BJT where the recess in which the base region is grown extends under the base polysilicon layer and also extends laterally into the base polysilicon layer as well. Thus, when the base region is selectively grown, in addition to contacting an underside of the conductive base layer, the base region contacts sidewalls of the conductive base layer to increase the contact area (i.e., decrease contact resistance) compared to other approaches. In addition, rather than a rounded bottom surface, in some embodiments the base region can include a planar bottom surface, which increases contact area between the base region and the collector region and correspondingly decreases resistance at the collector/base junction, compared to other approaches.

Figure 1A:
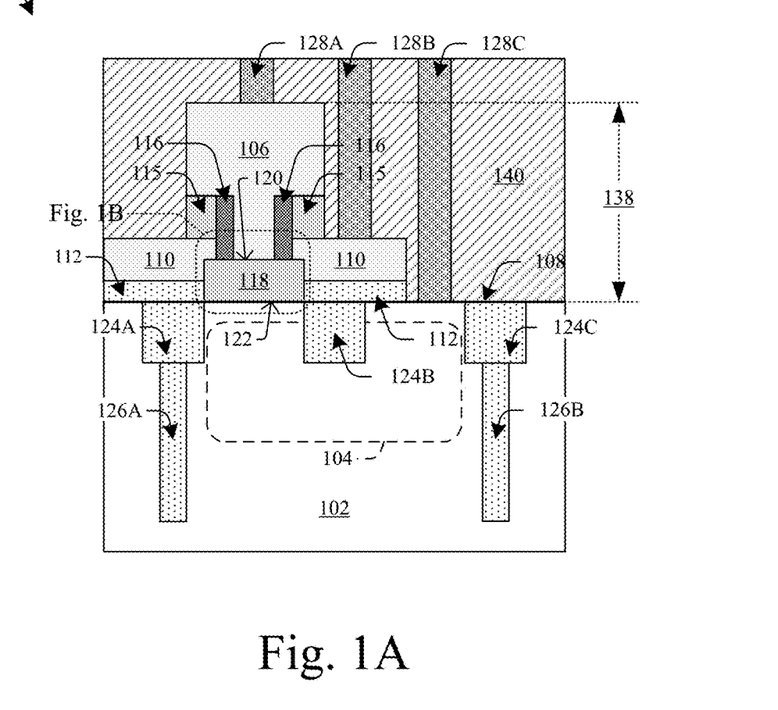
FIGS. 1A-1B illustrate cross-sectional views of some embodiments of bipolar junction transistors (BJTs) in accordance with the present disclosure.

FIG. 1A illustrates a cross-sectional view of some embodiments of a BJT 100. The BJT 100 includes a collector region 104 having a first conductivity type (e.g., n-type with a first doping concentration), which is arranged within a semiconductor substrate 102. A base region 118 (e.g., p-type) is arranged over the collector region 104, and meets the collector region 104 at a collector/base junction 122. An emitter region 106 having the first conductivity type (e.g., n-type with a second doping concentration that is greater than the first doping concentration) is arranged over the base region 118, and meets the base region 118 at a base/emitter junction 120. The collector region 104, base region 118, and emitter region 106 are each made of semiconductor material, and are often in an n-p-n arrangement as this provides for higher performance, although p-n-p arrangements are also possible. In some embodiments of the BJT 100, the substrate 102 is silicon, the base region 118 is silicon-germanium, and the emitter region 106 is polysilicon. When silicon-germanium or other semiconductor materials having a bandgap that is narrower than that of silicon is used for the base region 118, the resultant bipolar BJT tends to have a higher gain compared to BJTs where silicon is used for the base region, but both approaches are contemplated as falling within this disclosure.

Figure 1B:
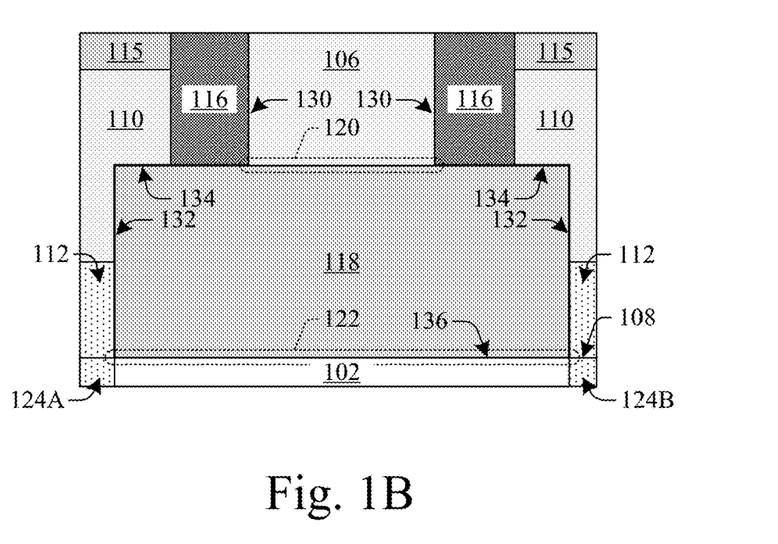

FIG. 1B illustrates an exploded cross-sectional view of the BJT 100. As shown in FIGS. 1A-1B, a base dielectric layer 112 separates a conductive base layer 110 from an upper substrate surface 108. In some embodiments, the conductive base layer 110 is polysilicon and has the first conductivity type, and the base dielectric layer 112 is an oxide (e.g., $SiO_2$) which is less than 500 angstroms (Å) thick. A spacer layer 116 (e.g., silicon nitride (SiN)) is arranged along vertical sidewalls 130 of the emitter region 106, and electrically isolates a lower portion of the emitter region 106 from the conductive base layer 110. An inter-poly dielectric (IPD) layer 115 (e.g., SiN) separates outer edges of an upper portion of the emitter region 106 from the conductive base layer 110.

For the embodiments of FIGS. 1A-1B, the emitter region 106 and the collector region 104 include n-type silicon (Si) and the base region 118 is p-type SiGe. Consequently, for the embodiments of FIGS. 1A-1B, the emitter region 106, the base region 118, and the collector region 104 form an n-p-n junction of a heterojunction bipolar transistor (HBT). Charge flow through the BJT 100 results from diffusion of charge carriers across the emitter/base junction 120, through the base region 118, and across the collector/base junction 122. The charge flow results from independent biasing of the emitter region 106, the base region 118, and the collector region 104 by first through third contacts 128A-128C. In various embodiments, the first through third contacts 128A-128C include one or more conductive materials including copper (Cu), aluminum (Al), tungsten (W), etc. The first contact 128A connects to the emitter region 106, the second contact 128B connects to the base region 118 through the conductive base layer 110, and the third contact 128C connects to the collection region 104. The first through third contacts 128A-128C are arranged within an inter-layer dielectric (ILD) 140.

In an "on" state of the BJT 100, the first through third contacts 128A-128C are biased such that there is a positive potential difference between the base region 118 and both the emitter region 106 and the collector region 104 (i.e., positive potential difference across the emitter/base junction 120 and the collector/base junction 122). As a result, electrons are injected from the emitter region 106 into the base region 118. The electrons are minority carriers within the p-type base region 118, which diffuse toward the collector region 104. Most of the current though the BJT 100 is carried by the electrons moving through the p-type base region 118. A small portion of the current may also result from a recombination of charge carriers (i.e., electrons and holes) at the emitter/base junction 120 and the collector/base junction 122.

Returning to FIG. 1B, the BJT 100 has an advantage over some conventional BJTs in that is has an increased contact area between the conductive base layer 110 and the base region 118, along vertical sidewalls 132 and an upper surface 134 of the base region 118. In particular, the vertical sidewalls 132 extend continuously from the upper surface 134 of the base region 118 to the upper surface 108 of the semiconductor substrate 102. In some conventional approaches, the base region 118 only contacts the conductive base layer 110 along its upper surface 134, which decreases contact area and hence increases resistance relative to the BJT 100.

The BJT 100 has a further advantage over some conventional BJTs of increased contact area between the base region 118 and the collector region 104 of the semiconductor substrate 102 along a planar bottom surface 136 of the base region 118. In the conventional BJT, the base region 118 has a rounded bottom surface, which consequently reduces contact area and thus increases resistance at the collector/base junction 122 of the BJT 100.

Increasing the contact area between the conductive base layer 110 and the base region 118, as well as along the collector/base junction 122, also increases a cut-off frequency of the BJT 100 due to transit time reductions across the collector/base junction 122. In addition, by forming the opening within the conductive base layer 110 instead of a dielectric layer arranged below the conductive base layer 110, the dielectric layer can be eliminated. As a result, a step height 138 between a top of the emitter region 106 and the upper surface 108 of the semiconductor substrate 102 can be reduced over the some conventional methods.

It is also noted that BJT 100 includes first through third shallow trench isolation (STI) structures 124A-124C (e.g., oxide) arranged within the upper surface 108 of the semiconductor substrate 102. The first and third STI structures 124A, 124C are laterally separated by the collector region 104. The first and second STI structures 124A, 124B are laterally separated by a region of the semiconductor substrate 102 (and collector region 104) located below the SiGe base region 118. The BJT 100 also includes first and second deep trench isolation (DTI) structures 126A, 126B, which laterally isolate the collector region 104 from other regions of the semiconductor substrate 102.

Figure 2:
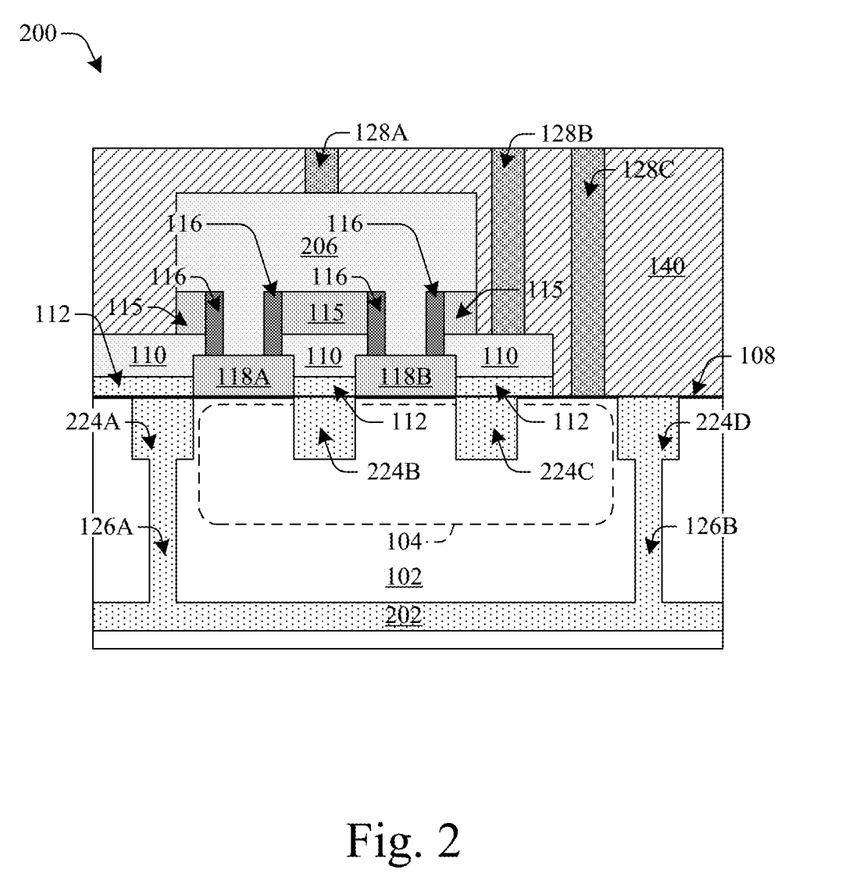
FIG. 2 illustrates cross-sectional views of some embodiments of BJT in accordance with the present disclosure.

FIG. 2 illustrates a cross-sectional view of a BJT 200 in accordance with some embodiments. Whereas FIG. 1A's BJT 100 has an emitter region 106 with a "T-shaped" cross section, FIG. 2's BJT 200 has a an emitter region 206 with a "pi-shaped" cross section, which is essentially two T-shaped emitter regions 106 merged together. The pi-shaped emitter region 106 connects to first and second base regions 118A, 118B, which connect to a collector region 104 of a semiconductor substrate 102. The pi-shaped emitter region 206 of the BJT 200 essentially doubles the electron current over the T-shaped emitter region 106 of the BJT 100, by doubling the cross-sectional area of the emitter/base and collector/base junctions.

The BJT 200 includes first through fourth STI structures 224A-224D, which are arranged within an upper surface 108 of the semiconductor substrate 102. The first and fourth STI structures 224A, 224D are laterally separated by the collector region 104. The second STI structure 224B laterally separates portions of the collector region 104 directly below the first and second base regions 118A, 118B. The BJT 200 also includes first and second DTI structures 126A, 126B, which laterally isolate the collector region 104 from other regions of the semiconductor substrate 102. The first and fourth STI structures 224A, 224D extend from the upper surface 108 of the semiconductor substrate 102 to upper portions of the first and second DTI structures 126A, 126B, respectively. The first and second DTI structures 126A, 126B extend from the first and fourth STI structures 224A, 224D to an upper portion of a buried oxide (BOX) isolation structure 202. Consequently, the first and fourth STI structures 224A, 224D, the first and second DTI structures 126A, 126B, and the BOX isolation structure 202, surround the collector region 104 and electrically isolate it from other regions of the semiconductor substrate 102.

Figure 3:
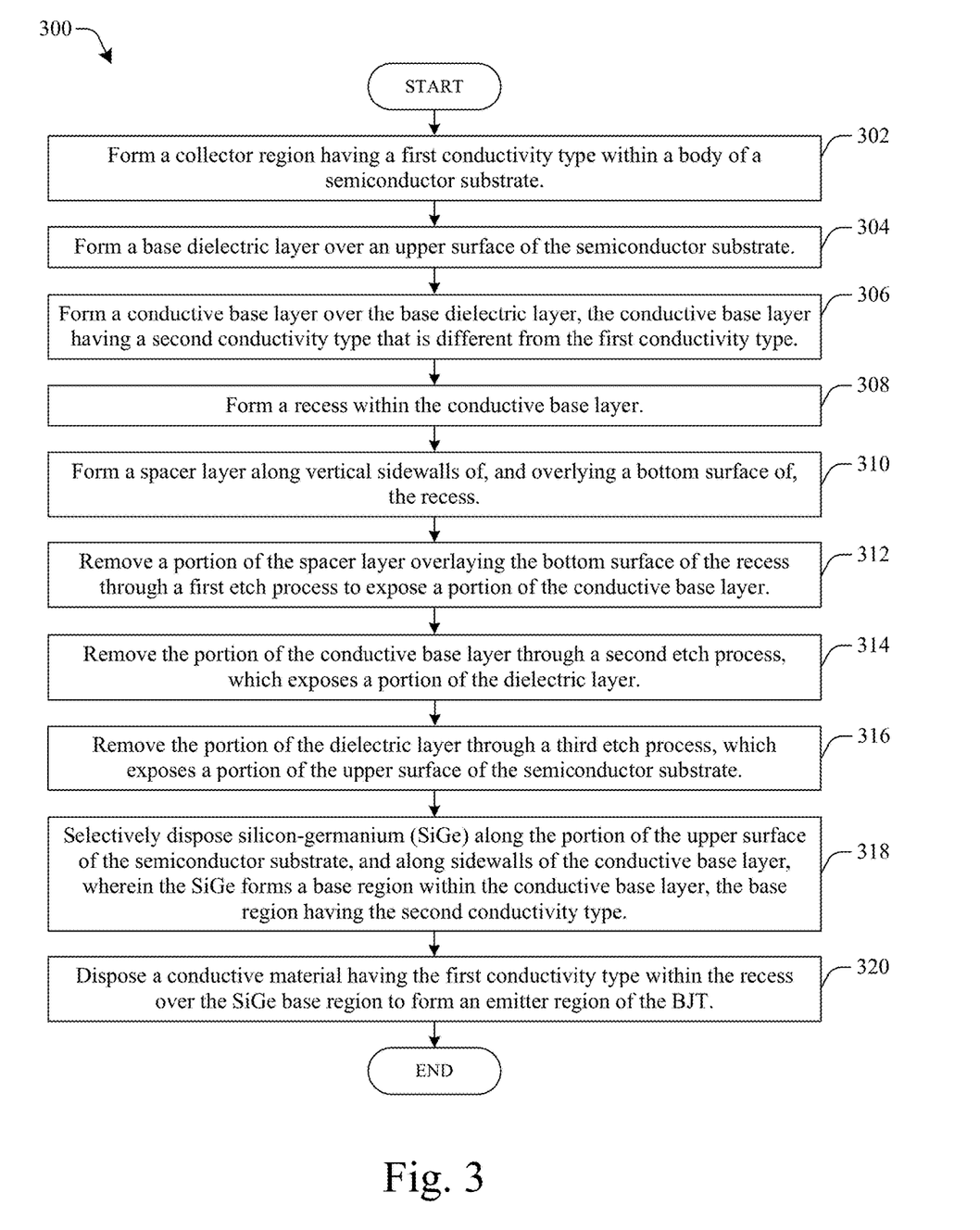
FIG. 3 illustrates a flow chart of some embodiments of a method of forming a BJT in accordance with the present disclosure.

FIG. 3 illustrates a flow chart of some embodiments of a method 300 of forming a BJT in accordance with the present disclosure. While the method 300 is described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a collector region having a first conductivity type (e.g., n-type or p-type) is formed within a body of a semiconductor substrate. In some embodiments, the collector region is formed by an implant of one or more dopants into a body of the semiconductor substrate.

At 304, a base dielectric layer is formed over an upper surface of the semiconductor substrate. In some embodiments, the base dielectric layer includes an oxide is formed by chemical vapor deposition (CVD), oxidation of the upper surface of the semiconductor substrate, or other appropriate dielectric layer formation technique.

At 306, a conductive base layer is formed over the base dielectric layer. The conductive base layer has a second conductivity type that (e.g., p-type or n-type, respectively), which is different from the first conductivity type. In some embodiments, the conductive base layer is formed by CVD or other appropriate layer formation technique.

At 308, a recess is formed within the conductive base layer.

At 310, a dielectric spacer layer is formed along vertical sidewalls of, and overlying a bottom surface of, the recess. In some embodiments, the spacer layer is formed by CVD or other appropriate layer formation technique.

At 312, the portion of the spacer layer overlaying the bottom surface of the recess is removed through a first etch process to expose a portion of the conductive base layer. In some embodiments, the first etch process is an anisotropic dry etch that removes the portion of the spacer layer overlaying the bottom surface of the recess.

At 314, the portion of the conductive base layer underlying the bottom surface of the recess is removed through a second etch process, which exposes a portion of the base dielectric layer. In some embodiments, the second etch process is an isotropic selective dry etch, which etches the recess vertically to the upper surface of the base dielectric layer, and laterally within the conductive base layer, while leaving the base dielectric layer substantially intact. The resulting recess has a cross-sectional profile of an inverted T-shape. The inverted T-shaped recess includes a horizontal portion formed within the conductive base layer. In some embodiments, the horizontal portion includes a planar bottom surface that abuts a top surface of the base dielectric layer; the horizontal portion can also include substantially planar vertical sidewalls. In other embodiments, the sidewalls can be rounded, due to nature of the isotropic etch.

At 316, the portion of the base dielectric layer underlying the bottom surface of the recess is removed through a third etch process, which exposes a portion of the upper surface of the semiconductor substrate. In some embodiments, the third etch process is a selective etch with an etch selectivity between the base dielectric layer and the conductive base layer, such that it etches the portions of the base dielectric layer underlying the bottom surface of the recess while leaving the conductive base layer substantially intact. Consequently, the recess has a planar bottom surface that abuts the upper surface of the semiconductor substrate.

At 318, SiGe is selectively disposed along the upper surface of the semiconductor substrate, and along sidewalls of the conductive base layer. The SiGe forms a base region coupled to the conductive base layer, the base region having the second conductivity type. Consequently, the SiGe base region has a rectangular shape or substantially rectangular shape, with a flat/planar bottom surface that contacts the upper surface of the semiconductor substrate. In some embodiments, the SiGe base region also has planar or substantially sidewalls, a portion of which contacts the conductive base layer, and a planar or substantially planar upper surface, a portion of which also contacts the conductive base layer. The base region can also have rounded sidewalls and/or a rounded upper planar surface.

At 320, a semiconductor or conductive material having the first conductivity type is formed within the recess over the SiGe base region, to form an emitter region of the BJT.

FIGS. 4-19 illustrate some embodiments of a series of cross-sectional views that collectively depict formation of a BJT in accordance with the present disclosure. Although FIGS. 4-19 are described in relation to the method 300, it will be appreciated that the structures disclosed in FIGS. 4-19 are not limited to the method 300, but instead may stand alone as structures independent of the method 300. Similarly, although the method 300 is described in relation to FIGS. 4-19, it will be appreciated that the method 300 is not limited to the structures disclosed in FIGS. 4-19, but instead may stand alone independent of the structures disclosed in FIGS. 4-19.

Figure 4:
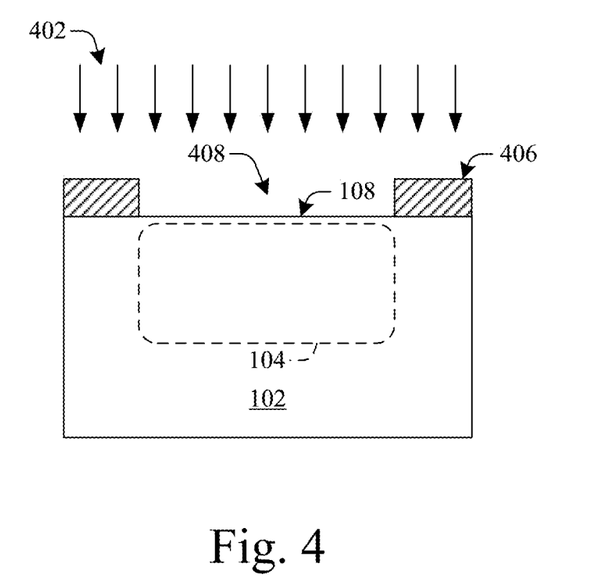
FIGS. 4-19 illustrate some embodiments of a series of cross-sectional views that collectively depict formation of BJT in accordance with the present disclosure.

In FIG. 4, which corresponds to act 302 of the method 300, the collector region 104 having a first conductivity type has been formed within a body of a semiconductor substrate 102. The collector region 104 has been formed through the implantation of one or more dopants 402 through an opening of a mask 406 (e.g., SiN), which has been disposed and patterned over an upper surface 108 of the semiconductor substrate 102. For the embodiments of FIGS. 4-19, the first conductivity type is n-type, and the dopants 402 include donors such as phosphorous (P), arsenic (As), antimony (Sb), or bismuth (Bi), etc., which forms an n-type collector region 104. The substrate 102 can be a bulk silicon substrate, a silicon-on-insulator substrate, a binary compound semiconductor substrate, ternary compound semiconductor substrate, or higher order compound semiconductor substrate, among others.

Figure 5:
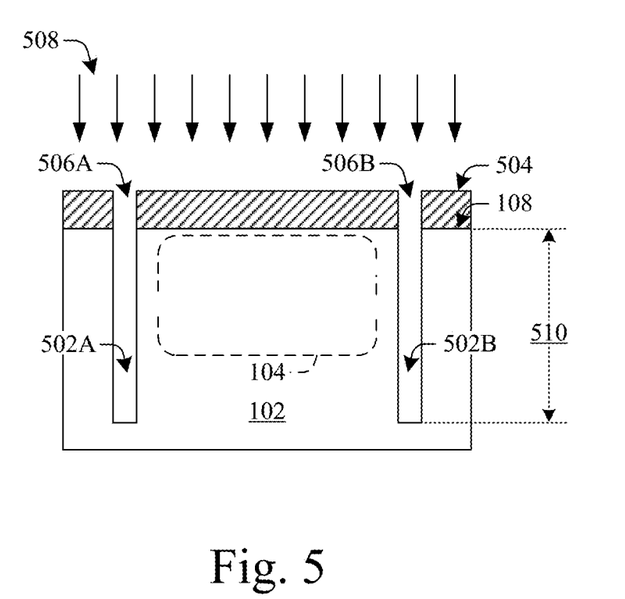

In FIG. 5, first and second deep trenches 502A, 502B have been formed within the semiconductor substrate 102 through an etch. The etch uses a mask 504, which has been disposed over an upper surface 108 of the semiconductor substrate 102, and which has then been patterned to form first and second openings 506A, 506B, which correspond to the first and second deep trenches 502A, 502B. The semiconductor substrate 102 has then been exposed to an etchant 508 (e.g., wet or dry etchant) according to the mask 504 to form the first and second deep trenches 502A, 502B having a first depth 510.

Figure 6:
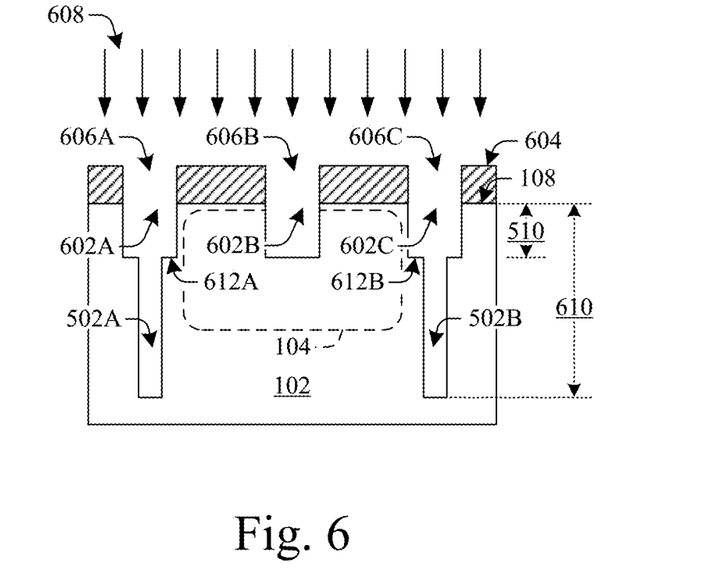

In FIG. 6, first through third shallow trenches 602A-602C have been formed within the semiconductor substrate 102 through an etch. The etch uses a mask 604 that has been disposed over an upper surface 108 of the semiconductor substrate 102. The mask 604 has then been patterned to form first through third openings 606A-606C, which correspond to the first through third shallow trenches 602A-602C. The upper surface 108 of the semiconductor substrate 102 has then been exposed to an etchant 608 according to the mask 604 to form the first through third shallow trenches 602A-602C. The first and third shallow trenches 602A, 602C are centered over the first and second deep trenches 502A, 502B. The first and second deep trenches 502A, 502B extend from lower surfaces 612A, 612B of the first and third shallow trenches 602A, 602C to a second depth 610, which is less than the first depth 510.

Figure 7:
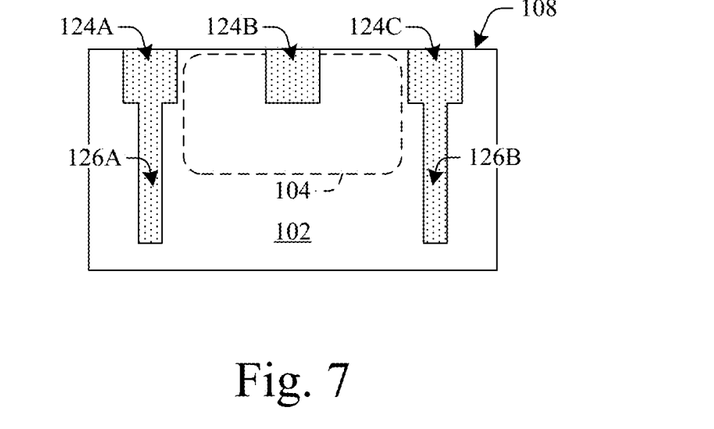

In FIG. 7, the first through third shallow trenches 502A-502C and the first and second deep trenches 602A, 602B have been filled with a dielectric material (e.g., $SiO_2$) to form first through third STI structures 124A-124C and first and second DTI structures 126A, 126B. In various embodiments, filling with the dielectric material includes deposition process(es) such as CVD (e.g., low-pressure CVD (LPCVD) or plasma-enhanced CVD (PECVD)), physical vapor deposition (PVD), atomic layer deposition (ALD), molecular beam epitaxy (MBE), electron beam (e-beam) epitaxy, or other appropriate process. Upon formation of the first through third STI structures 124A-124C and first and second DTI structures 126A, 126B, excess dielectric material is removed from the upper surface 108 of the semiconductor substrate 102 through a planarization process such as a chemical mechanical polish (CMP).

Figure 8:
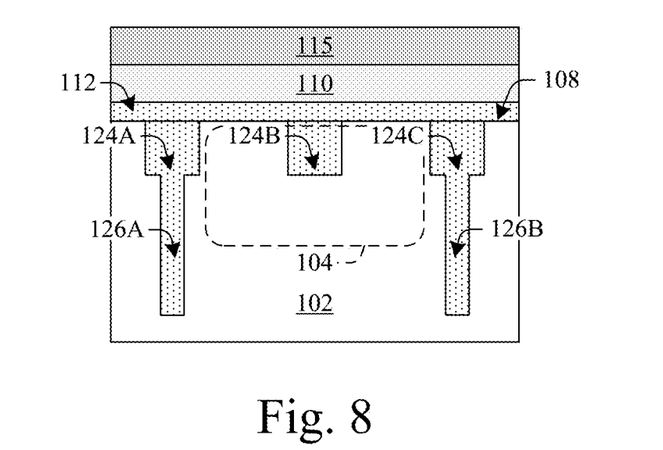

In FIG. 8, which corresponds to acts 304 and 306 of the method 300, a base dielectric layer 112 has been formed over the upper surface 108 of the semiconductor substrate 102 by CVD, wet or dry oxidation, or other appropriate process. A conductive base layer 110 (e.g., polysilicon) has then been formed over the base dielectric layer 112. An IPD layer 115 (e.g., SiN) has then been formed over the conductive base layer 110.

Figure 9:
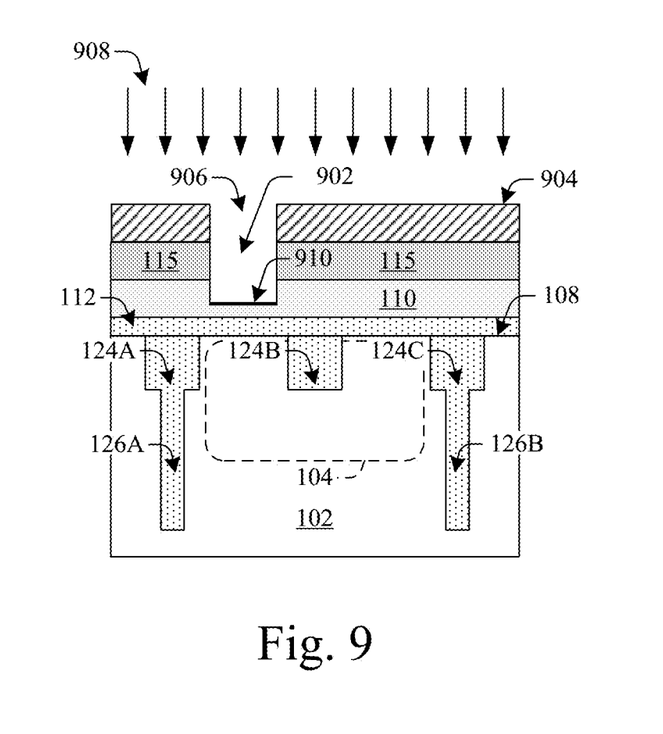

In FIG. 9, which corresponds to act 308 of the method 300, a recess 902 has been formed within the conductive base layer. In some embodiments, the recess 902 is formed through an etch. The etch uses a mask 904, with an opening 906 that corresponds to the recess 902. The semiconductor substrate 102 has then been exposed to an etchant 908 according to the mask 904 to form the recess 902. The recess 902 extends downward to a bottom surface 910 which is vertically within the conductive base layer material 110 (e.g., polysilicon). Thus, the recess 902 extends partially into the conductive base layer 110, but not completely through the conductive base layer material 110. For example, in some embodiments, the recess 902 can extend to a depth of between 10% and 90% of the total thickness of the conductive base layer 110, or to a depth of between 40% and 60% of the total thickness in various embodiments.

Figure 10:
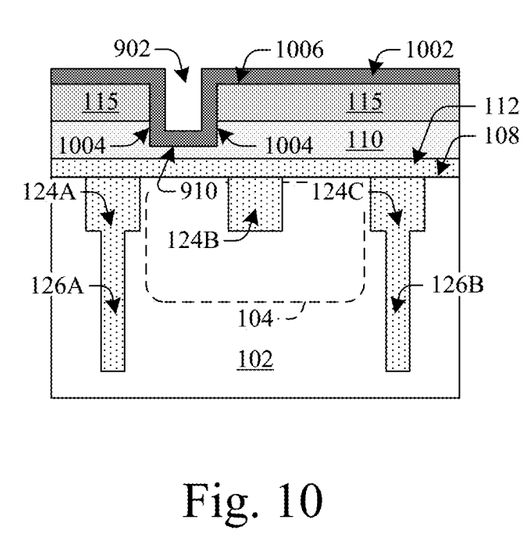

In FIG. 10, which corresponds to act 310 of the method 300, a spacer layer 1002 has been formed along vertical sidewalls 1004 of the recess 902. The spacer layer 1002 can be a conformal layer that overlays the bottom surface 910 of the recess 902, as well as an upper surface 1006 of the IPD layer 115. In some embodiments, the spacer layer 1002 has been formed by CVD or other appropriate layer formation technique.

Figure 11:
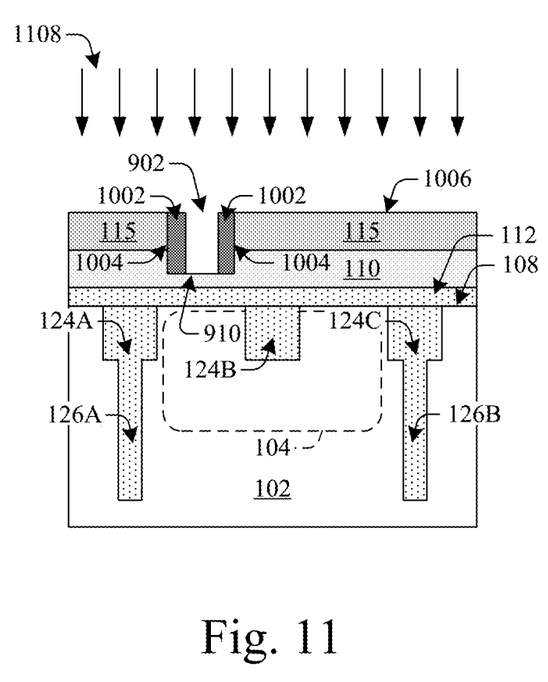

In FIG. 11, which corresponds to act 312 of the method 300, a portion of the spacer layer 1002 overlaying the bottom surface 910 of the recess 902 has been removed through a first etch process, such that the bottom surface 910 of the recess 902 again corresponds to a portion of the conductive base layer material 110. In some embodiments, the first etch process is an anisotropic dry etch with one or more etchants 1108 including $CHF_3$ and/or $CF_4$ to form dielectric spacer.

Figure 12:
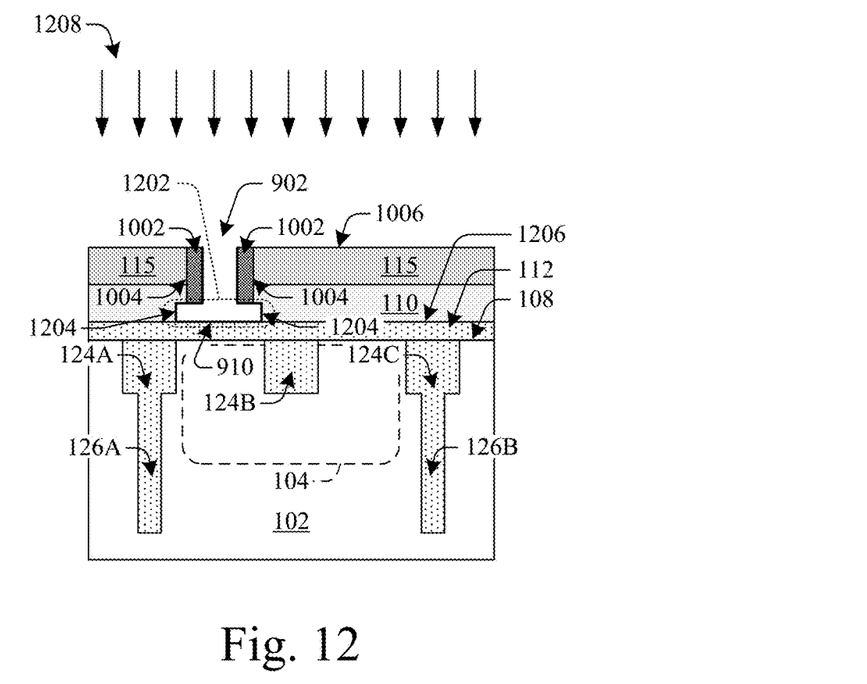

In FIG. 12, which corresponds to act 314 of the method 300, the portion of the conductive base layer 110 underlying the recess 902 has been removed through a second etch and a third etch process, which exposes a portion of the base dielectric layer 112. In some embodiments, the second etch process is an anistropic and selective dry etch by HBr and $O_2$ to stop on 112. The third etch is an isotropic etch with a selectivity between the spacer layer 1002/base dielectric layer 112 and the conductive base layer 110, such that it etches the conductive base layer 110 while leaving the spacer layer 1002 and the base dielectric layer 112 substantially intact. The gas ratio of $SF_6:O_2$ is less than 1 with zero bias power. Consequently, the third etch etches the recess 902 vertically to an upper surface 1206 of the base dielectric layer 112. The third etch also etches the recess 902 laterally within the conductive base layer 110. The resulting recess 902 has a cross-sectional profile of an inverted T-shape. The inverted T-shaped recess includes a horizontal portion 1202 formed within the conductive base layer 110. The horizontal portion 1202 includes a planar bottom surface 910 that abuts an upper surface 1206 of the base dielectric layer 112. In some embodiments, the horizontal portion 1202 also includes substantially vertical sidewalls 1204, but in other embodiments the sidewalls 1204 will be rounded. In some embodiments, the third etch process is an isotropic etch with one or more etchants 1208 including sulfur hexafluoride ($SF_6$) and oxygen ($O_2$).

Figure 13:
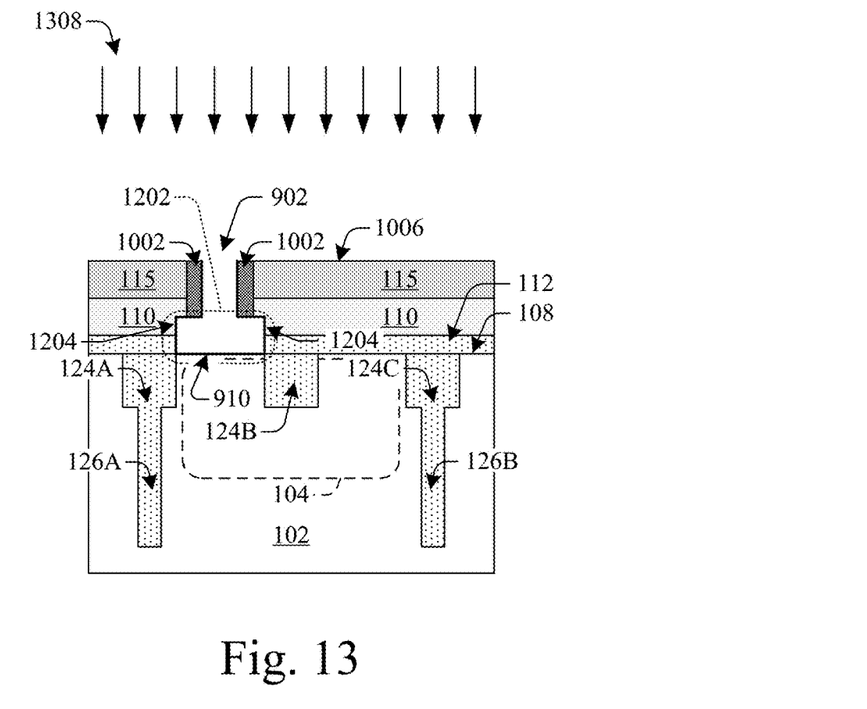

In FIG. 13, which corresponds to act 316 of the method 300, the portion of the base dielectric layer 112 underlying the recess 902 has been removed through a forth etch process, such that its bottom surface 910 of the recess 902 is coincident with the upper surface 108 of the semiconductor substrate 102. In some embodiments, the forth etch process includes a selective etch with an etch selectivity between the conductive base layer 110/spacer layer 1002 and the base dielectric layer 112, such that it etches the portions of the base dielectric layer 112 underlying the bottom surface 910 of the recess 902 while leaving the conductive base layer 110 and the spacer layer 1002 substantially intact. Consequently, the recess has a planar bottom surface that abuts the upper surface of the dielectric layer. In some embodiments, the forth etch process utilizes wet etch 1308 including fluoride compounds such as hydrofluoric acid (HF). Although this forth etch process is illustrated as terminating at the upper substrate surface 108 in FIG. 13, in other embodiments, the forth etch can extend slightly downward into the substrate 102 such that the lower surface of the recess 1202 is below the interface between the base dielectric layer 112 and the upper substrate surface 108.

Figure 14A:
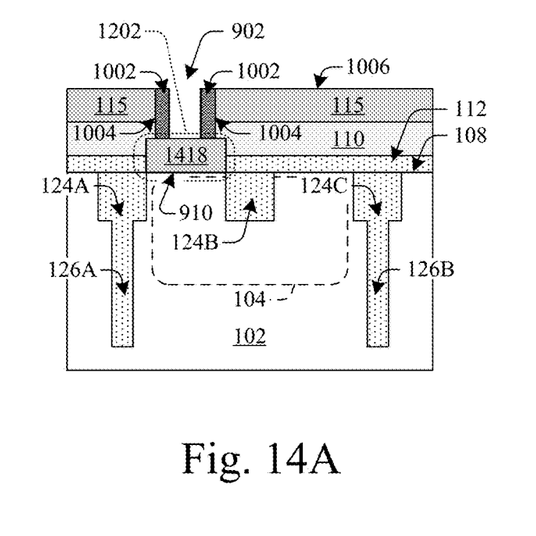
Figure 14B:
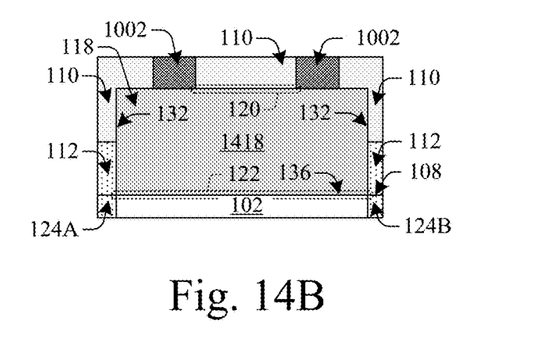

In FIG. 14A, which corresponds to act 318 of the method 300, a semiconductor material 1418 having a second conductivity type (e.g., p-type), which is opposite the first conductivity type, is selectively disposed along the bottom surface 910 of the recess 902 on the upper surface 108 of the semiconductor substrate 102, and along sidewalls 1204 of the conductive base layer 110. In some embodiments, the semiconductor material 1418 includes SiGe, and the semiconductor substrate 102 and conductive base layer 110 includes silicon (Si). Consequently, the SiGe bonds epitaxially to the Si of the semiconductor substrate 102 and conductive base layer 110, but not to the base dielectric layer 112 (e.g., $SiO_2$). FIG. 14B illustrates such an embodiment, where the selectively grown semiconductor material 1418 forms a SiGe base region 118, having a rectangular shape with substantially vertical sidewalls 132, and a planar bottom surface 136 along the collector/base junction 122. Although not illustrated, the bottom of the base region 1418 can extend below upper substrate surface 108 in some embodiments, and/or the sidewalls 132 can be rounded.

Figure 14C:
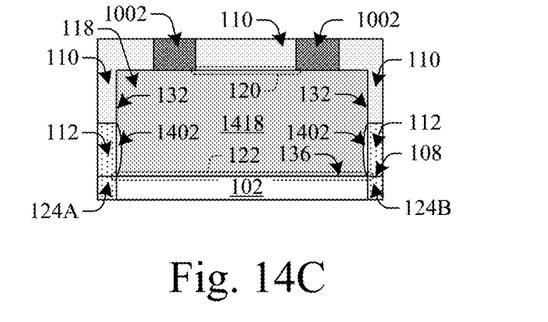

FIG. 14C illustrates an additional embodiment, where the selectively grown semiconductor material 1418 includes facets 1402 formed along the vertical sidewalls 132. The facets 1402 result from a lack of epitaxial adhesion between the material 1418 and the base dielectric layer 112. The facets 1402 result in small gaps and non-planar portions of the vertical sidewalls 132 along the base dielectric layer 112.

In some embodiments, a concentration of germanium (Ge) in the SiGe base region 118 is graded, making a bandgap of the SiGe narrower at the collector/base junction 122 than at the emitter/base junction 120. The grading of the Ge concentration leads to a field-assisted transport in of electrons within the SiGe base region 118, which creates an accelerating electric field the electron diffusing through the SiGe base region 118. The grading of the Ge concentration consequently increases electron diffusion through the SiGe base region 118.

Figure 15:
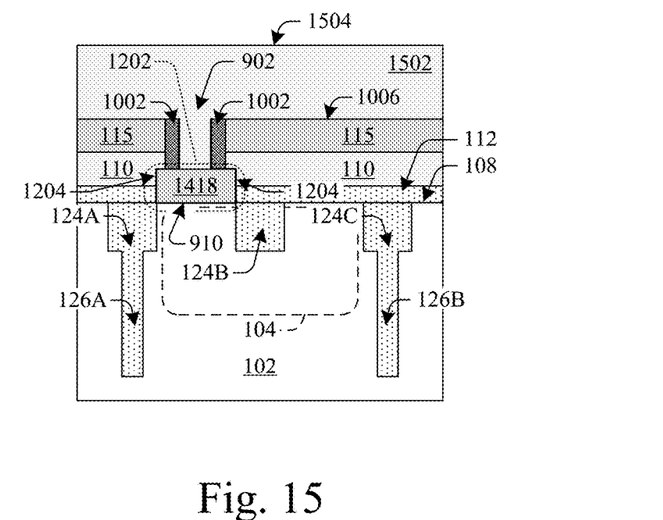

In FIG. 15, which corresponds to act 320 of the method 300, a remaining portion of the recess 902 has been filled with a semiconductor or conductive material 1502 having the first conductivity type. The semiconductor or conductive material 1502 extends over the upper surface 1006 of the IPD layer 115. In some embodiments, the semiconductor or conductive material 1502 includes polysilicon, which has been doped with one or more donor dopants such as P, As, Sb, Bi, etc., and which has been disposed by CVD or other appropriate layer disposal technique. An upper surface 1504 of the semiconductor or conductive material 1502 has then been planarized by a CMP or other appropriate process.

Figure 16:
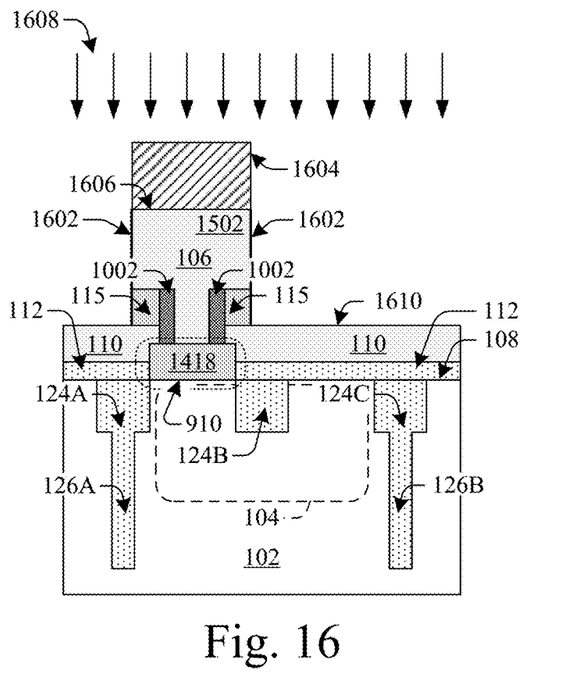

In FIG. 16, which corresponds to act 320 of the method 300, the material 1502 (and underlying IPD layer 115) has been etched to form an emitter region 106. The etch uses a mask 1604 that has been disposed over the upper surface 108 of the semiconductor substrate 102, and patterned. The material 1502 (and underlying IPD layer 115) has then been exposed to an etchant 1608 according to the mask 1604 to form the emitter region 106. In various embodiments, the etchant 1608 includes a wet or dry etchant. As a result of the etch, vertical sidewalls 1502 of the emitter 106 and the IPD layer 115 form a continuous planar surface 1602, which extends from an upper surface 1606 of the emitter region 106 to the upper surface 1610 of the conductive base layer 110.

Figure 17:
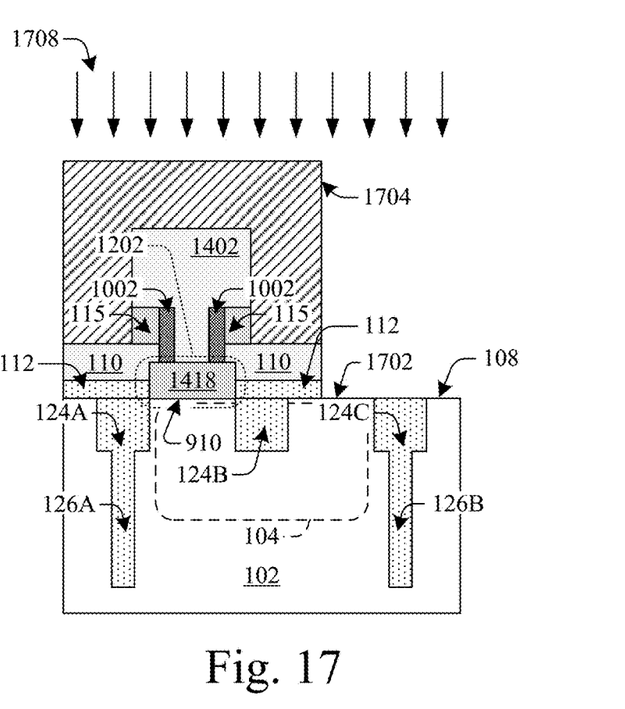

In FIG. 17, which corresponds to act 320 of the method 300, the conductive base layer 110 (and underlying base dielectric layer 112) has been etched to expose a portion 1702 of the upper surface 108 of the semiconductor substrate 102. The etch uses a mask 1704 that has been disposed and patterned. The conductive base layer 110 (and underlying base dielectric layer 112) has then been exposed to an etchant 1708 (e.g., a wet or dry etchant) according to the mask 1704.

Figure 18:
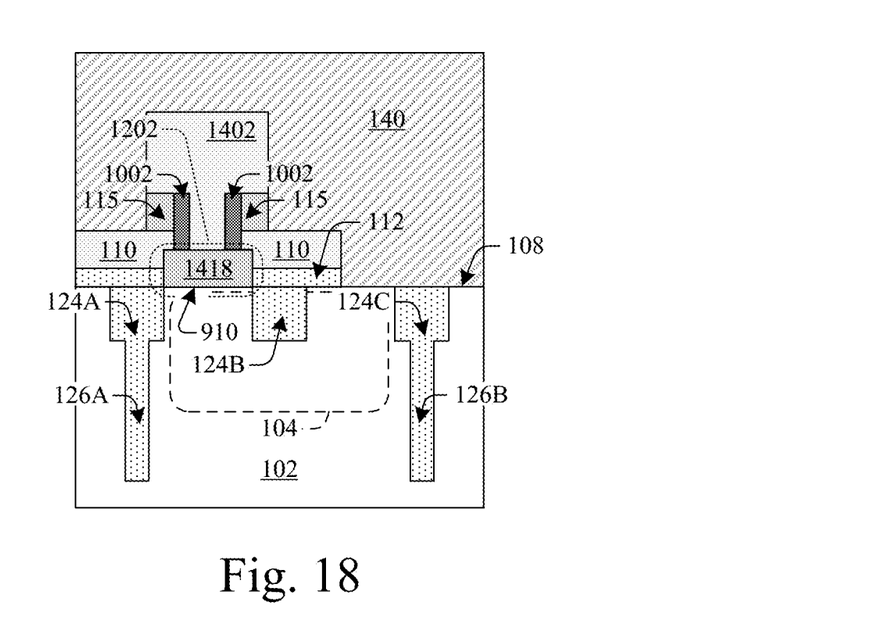

In FIG. 18, which corresponds to act 320 of the method 300, an ILD 140 has been disposed over the upper surface 108 of the semiconductor substrate 102. In various embodiments, ILD 140 includes an oxide or low-k dielectric material.

Figure 19:
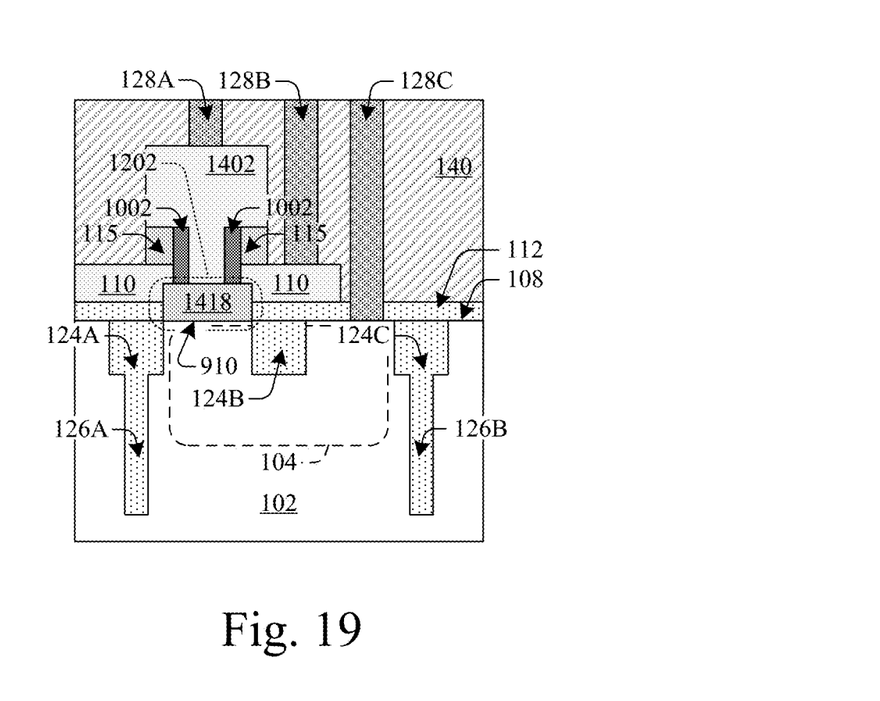

In FIG. 19, which corresponds to act 320 of the method 300, first through third contacts 128A-128C have been formed within the ILD 140. In some embodiments, formation of the first through third contacts 128A-128C includes an etch of the ILD 140 to form trenches corresponding to the first through third contacts 128A-128C. The trenches have then been filled with a one or more conductive materials (e.g., Cu, Al, W, etc.) to form the first through third contacts 128A-128C.

Therefore, the present disclosure is directed to a bipolar junction transistor (BJT) with a collector region formed within a body of a semiconductor substrate, and an emitter region arranged over an upper surface of the semiconductor substrate. The BJT includes a base region arranged over the upper surface of the semiconductor substrate, which vertically separates the emitter and collector regions. The base region is arranged within, and in contact with, a conductive base layer, which delivers current to the base region. The base region includes a planar bottom surface, which increases contact area between the base region and the semiconductor substrate, thus decreasing resistance at the collector/base junction, over some conventional approaches. The base region also includes substantially vertical sidewalls, which increases contact area between the base region and the conductive base layer, thus improving current delivery to the base region.

Some embodiments relate to a transistor, comprising a collector region arranged within a body of a semiconductor substrate, the collector region having a first conductivity type. The transistor also comprises a base dielectric arranged over an upper surface of the semiconductor substrate and including a base dielectric opening over the collector region. The transistor further comprises a SiGe base region arranged within the base dielectric opening, the SiGe base region having a second conductivity type that is different from the first conductivity type and meeting the collector region at a collector/base junction. The transistor further comprises a polysilicon base layer contacting both an upper surface and sidewalls of the SiGe base region and extending laterally over an upper surface of the base dielectric. The transistor further comprises a polysilicon emitter region arranged over the SiGe base region. The emitter region has the first conductivity type and meeting the SiGe base region at a base/emitter junction.

Other embodiments relate to a method, comprising forming a collector region within a body of a semiconductor substrate, the collector region having a first conductivity type. The method also comprises forming a dielectric layer over an upper surface of the semiconductor substrate, and forming a conductive base layer over the dielectric layer. The conductive base layer has a second conductivity type, which is different from the first conductivity type. The method also comprises forming a recess within the conductive base layer, and forming a spacer layer along vertical sidewalls of, and overlying a bottom surface of, the recess. The method further comprises extending the recess through a portion of the spacer layer overlaying the bottom surface of the recess through a first etch process. The method further comprises extending the recess through a portion of the conductive base layer underlying the bottom surface of the recess through a second etch process, such that the bottom surface of the recess abuts an upper surface of the dielectric layer. The method further comprises extending the recess through a portion of the dielectric layer underlying the bottom surface of the recess through a third etch process, such that the bottom surface of the recess abuts the upper surface of the semiconductor substrate. The method further comprises selectively disposing silicon-germanium (SiGe) along the bottom surface of the recess on the upper surface of the semiconductor substrate, and along sidewalls of the conductive base layer, wherein the SiGe forms a base region within the conductive base layer, the base region having the second conductivity type.

Still other embodiments relate to a transistor, comprising a collector region formed within a body of a semiconductor substrate, the collector region having a first conductivity type. The transistor also comprises an emitter region arranged over an upper surface of the semiconductor substrate, the emitter region having the first conductivity type. The transistor further comprises a silicon-germanium (SiGe) base region arranged over the upper surface of the semiconductor substrate and vertically separating the emitter and collector regions, the SiGe base region having a second conductivity type that is different from the first conductivity type and having substantially vertical sidewalls, which extend continuously from an upper surface of the SiGe base region to the upper surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
a collector region arranged within a body of a semiconductor substrate, the collector region having a first conductivity type;
a base dielectric arranged over an upper surface of the semiconductor substrate;
a base region extending through the base dielectric, the base region having a second conductivity type that is different from the first conductivity type and meeting the collector region at a collector/base junction;
a base layer having lower inner sidewalls directly contacting outer sidewalls of the base region and having an upper sidewall region that extends laterally over and directly contacts an uppermost surface of the base region, the base layer extending laterally over an upper surface of the base dielectric, and the base layer continuously extends from the outer sidewalls of the base region to the uppermost surface of the base region, wherein the base layer has a first thickness between a topmost surface of the base layer and the uppermost surface of the base region and has a second thickness between the topmost surface of the base layer and a topmost surface of the base dielectric, the first and second thicknesses being measured perpendicular to the upper surface of the semiconductor substrate and the first thickness being less than the second thickness; and
an emitter region over the base region, the emitter region having the first conductivity type and meeting the base region at a base/emitter junction.

2. The transistor of claim 1, wherein the collector region is made of silicon (Si), the base region is made of silicon germanium (SiGe), the base layer is made of polysilicon, and the emitter region is made of polysilicon.

3. The transistor of claim 2, wherein the emitter region is T-shaped or Pi-shaped, and further comprising a dielectric layer arranged between a lower horizontal surface of the T-shaped or the Pi-shaped emitter and an upper surface of the polysilicon base layer.

4. The transistor of claim 3,
wherein vertical sidewalls of a horizontal portion of the T-shaped or the Pi-shaped emitter and vertical sidewalls of the dielectric layer form a continuous planar surface, which extends from an upper surface of the emitter region to the upper surface of the polysilicon base layer;
wherein a vertical portion of the T-shaped or the Pi-shaped emitter extends through the dielectric layer and the polysilicon base layer to an upper surface of the SiGe base region; and
wherein a vertical sidewall of the vertical portion of the T-shaped or the Pi-shaped emitter is separated from the dielectric layer and the polysilicon base layer by a spacer layer.

5. The transistor of claim 4, wherein the vertical sidewalls of the vertical portion of the T-shaped or the Pi-shaped emitter extend laterally past vertical sidewalls of the SiGe base region.

6. A transistor, comprising:
a collector region formed within a body of a semiconductor substrate, the collector region having a first conductivity type;
a base dielectric arranged over an upper surface of the semiconductor substrate;
an emitter region arranged over the base dielectric, the emitter region having the first conductivity type; and
a silicon-germanium (SiGe) base region arranged over the upper surface of the semiconductor substrate and vertically separating the emitter region and the collector region, the SiGe base region having a rectangular cross-section and a second conductivity type that is different from the first conductivity type and the rectangular cross-section having substantially vertical outer sidewalls, the substantially vertical outer sidewalls of the rectangular cross-section extending continuously from the upper surface of the semiconductor substrate, through the base dielectric, and to a height that is above an uppermost surface of the base dielectric and that corresponds to the emitter region.

7. The transistor of claim 6, wherein vertical sidewalls of the emitter region extend laterally past the substantially vertical sidewalls of the SiGe base region, such that the emitter region covers the SiGe base region.

8. The transistor of claim 7, further comprising a conductive base layer arranged over the upper surface of the semiconductor substrate between the emitter and collector regions, the conductive base layer having the second conductivity type, wherein the conductive base layer has an upper sidewall region that extends laterally over and directly contacts the uppermost surface of the SiGe base region.

9. The transistor of claim 8, wherein the conductive base layer is separated from the upper surface of the semiconductor substrate by a dielectric layer.

10. The transistor of claim 9, wherein the dielectric layer includes oxide and is less than 500 angstroms thick.

11. The transistor of claim 8, wherein the emitter region has a T-shape or a Pi-shape, and further comprising a dielectric layer arranged between a lower horizontal surface of the T-shaped or the Pi-shaped emitter region and an upper surface of the conductive base layer.

12. The transistor of claim 11, wherein the vertical sidewalls of the T-shaped or the Pi-shaped emitter region and vertical sidewalls of the dielectric layer form a continuous planar surface, which extends from an upper surface of the emitter region to the upper surface of the conductive base layer.

13. The transistor of claim 12, wherein a vertical portion of the T-shaped or the Pi-shaped emitter region extends through the dielectric layer and the conductive base layer to the uppermost surface of the SiGe base region.

14. The transistor of claim 13, wherein a vertical sidewall of the vertical portion of the T-shaped or the Pi-shaped emitter region is separated from the dielectric layer and the conductive base layer by a spacer layer.

15. The transistor of claim 6, further comprising first and second deep trench isolation (DTI) structures, which laterally isolate the collector region from other regions of the semiconductor substrate.

16. The transistor of claim 15, further comprising:
first and third shallow trench isolation (STI) structures, which extend from the upper surface of the semiconductor substrate to upper portions of the first and second DTI structures, respectively; and
a second STI structure arranged between the first and third STI structures;
wherein the first and third STI structures are separated by the collector region; and
wherein the first and second DTI structures extend to a first depth, which is beneath the upper surface of the semiconductor substrate, and which is greater than a second depth of the first, second, and third STI structures.

17. An integrated circuit including a bipolar junction transistor (BJT), the BJT comprising:
a collector region disposed within a semiconductor substrate, the collector region having a first conductivity type;
a first dielectric layer over an upper surface of the semiconductor substrate and covering a first portion the collector region but not covering a second portion of the collector region, the first dielectric layer having a first height as measured from an upper surface of the semiconductor substrate;
a SiGe base region extending along inner sidewalls of the first dielectric layer to contact the second portion of the collector region, the SiGe base region having a second conductivity type opposite the first conductive type and having a second height, which is greater than the first height, as measured from the upper surface of the semiconductor substrate;
a conductive base layer over the first dielectric layer and in electrical contact with the SiGe base region, the conductive base layer being made of polysilicon and having the second conductivity type, the conductive base layer having a lower portion with an innermost lower sidewall in direct contact with an upper outer sidewall of the SiGe base region, and the conductive base layer having an upper portion that extends laterally over an upper surface of the SiGe base region so an innermost upper sidewall of the conductive base layer resides directly over the upper surface of the SiGe base region;
an inter-poly dielectric layer disposed over an upper surface of the conductive base layer, the inter-poly dielectric layer having an inner sidewall aligned with the innermost upper sidewall of the conductive base layer;
a spacer of a single material directly contacting the upper surface of the SiGe base region and having an outer sidewall directly contacting both the innermost upper sidewall of the conductive base layer and an innermost sidewall of the inter-poly dielectric layer; and
an emitter layer having a lower emitter portion and an upper emitter portion and having the first conductivity type, the lower emitter portion being in direct contact with the upper surface of the SiGe base region and having lower outer sidewalls in contact with an innermost sidewall of the spacer, and the upper emitter portion having an upper outer sidewall aligned to an outer sidewall of the inter-poly dielectric layer.

18. The integrated circuit of claim 17, wherein an outermost sidewall of the conductive base layer is aligned to an outermost sidewall of the first dielectric layer.

19. The integrated circuit of claim 18, wherein the upper outer sidewall of the upper emitter portion is spaced apart from the outermost sidewall of the conductive base layer.

20. The integrated circuit of claim 19, wherein the spacer and inter-poly dielectric layer each comprise silicon nitride.

* * * * *